United States Patent
Ueda et al.

(10) Patent No.: US 9,190,117 B2
(45) Date of Patent: Nov. 17, 2015

(54) NONVOLATILE SEMICONDUCTOR MEMORY DEVICE

(71) Applicant: PANASONIC CORPORATION, Osaka (JP)

(72) Inventors: Takanori Ueda, Kanagawa (JP); Kazuyuki Kouno, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/340,518

(22) Filed: Jul. 24, 2014

(65) Prior Publication Data

US 2014/0334217 A1 Nov. 13, 2014

Related U.S. Application Data

(63) Continuation of application No. PCT/JP2013/000980, filed on Feb. 21, 2013.

(30) Foreign Application Priority Data

Feb. 29, 2012 (JP) .................................. 2012-043219

(51) Int. Cl.
*G11C 7/14* (2006.01)
*G11C 5/06* (2006.01)
(Continued)

(52) U.S. Cl.
CPC .. *G11C 5/06* (2013.01); *G11C 7/12* (2013.01); *G11C 7/14* (2013.01); *G11C 8/14* (2013.01); *G11C 13/0002* (2013.01); *G11C 13/0004* (2013.01); *G11C 13/004* (2013.01); *G11C 13/0007* (2013.01); *G11C 13/0038* (2013.01);
(Continued)

(58) Field of Classification Search
CPC .................................. G11C 7/14; G11C 16/28
USPC ....................................... 365/148, 163, 210.1
See application file for complete search history.

(56) References Cited

U.S. PATENT DOCUMENTS

| 5,917,753 | A | 6/1999 | Dallabora et al. |
| 2003/0048684 | A1 | 3/2003 | Tanzawa et al. |

(Continued)

FOREIGN PATENT DOCUMENTS

| JP | 2002-367390 A | 12/2002 |
| JP | 2004-234707 A | 8/2004 |
| JP | 2008-52841 A | 3/2008 |

OTHER PUBLICATIONS

Wataru Otsuka et al., "A 4Mb Conductive-Bridge Resistive Memory with 2.3GB/s Read-Throughout and 216MB/s Program-Throughout", 2011 IEEE International Solid-State Circuits Conference, Digest of Technical Papers, pp. 210-211, Feb. 22, 2011.

(Continued)

*Primary Examiner* — Hoai V Ho
*Assistant Examiner* — Jay Radke
(74) *Attorney, Agent, or Firm* — McDermott Will & Emery LLP

(57) ABSTRACT

A nonvolatile semiconductor memory device includes: a memory cell array having a plurality of memory cells arranged in a matrix; a reference bit line; a reference source line; at least one reference cell including first and second transistors serially connected between these lines; a reference word line connected to the gate of the first transistor; and a reference driver circuit configured to control the gate voltage of the second transistor.

6 Claims, 15 Drawing Sheets

(51) Int. Cl.
*G11C 13/00* (2006.01)
*G11C 7/12* (2006.01)
*G11C 8/14* (2006.01)
*G11C 16/28* (2006.01)

(52) U.S. Cl.
CPC ........ *G11C 16/28* (2013.01); *G11C 2013/0054* (2013.01)

(56) References Cited

U.S. PATENT DOCUMENTS

| 2004/0114444 A1 | 6/2004 | Matsuoka |
| 2005/0201182 A1 | 9/2005 | Osada et al. |
| 2006/0209585 A1* | 9/2006 | Tanizaki et al. ............... 365/148 |
| 2008/0049495 A1 | 2/2008 | Yamada |
| 2009/0003047 A1 | 1/2009 | Toda |
| 2009/0116290 A1 | 5/2009 | Yamada |
| 2011/0050330 A1 | 3/2011 | Miki et al. |
| 2011/0222355 A1 | 9/2011 | Nakashima et al. |

OTHER PUBLICATIONS

International Search Report issued in International Application No. PCT/JP2013/000980 with Date of mailing Mar. 26, 2013, with English Translation.

* cited by examiner

NONVOLATILE SEMICONDUCTOR MEMORY DEVICE

CROSS-REFERENCE TO RELATED APPLICATIONS

This is a continuation of International Application No. PCT/JP2013/000980 filed on Feb. 21, 2013, which claims priority to Japanese Patent Application No. 2012-043219 filed on Feb. 29, 2012. The entire disclosures of these applications are incorporated by reference herein.

BACKGROUND

The present disclosure relates to a nonvolatile semiconductor memory device, and more particularly to a technology of controlling a reference current.

At present, the workhorse of nonvolatile memory is flash memory. The flash memory however has problems of being large in power consumption and low in operation speed: a voltage as high as about 10 V is required to rewrite data, and the data rewrite time is of the order of microseconds or milliseconds. A circuit configuration of flash memory is disclosed in U.S. Pat. No. 5,917,753 (Patent Document 1), for example.

In recent years, development of novel nonvolatile memory devices that operate at low power and high speed is in progress. As one of nonvolatile memory devices, resistive random access memory (ReRAM) is known. The ReRAM, which achieves data rewrite of the order of nanoseconds and a voltage required for data rewrite of about 1.8 V, is operable at higher speed and lower power than flash memory.

As memory cells of the ReRAM, there are those configured as in FIGS. 14A and 14B, for example. FIG. 14A shows so-called 1T1R memory cells, where one memory cell comprises one selective transistor and one variable resistance element. FIG. 14B shows so-called cross-point memory cells, where one memory cell comprises one variable resistance element and one bidirectional diode.

The memory cell in FIG. 14A has a layout as shown in FIG. 15, for example. This memory cell has a four-layer structure, where a bit line BL is placed in a fourth layer M4 and a source line SL is placed in a first layer M1. A word line WL is a polysilicon interconnect. Since the polysilicon interconnect is high in wiring resistance and wiring capacitance, a backing interconnect WLX is provided in a second layer M2. The word line WL and the backing interconnect WLX are connected to each other at constant intervals. The interconnect layers are connected to one another through a via, and a variable resistance element RR is provided between a third layer M3 and the fourth layer M4 through the via.

Japanese Unexamined Patent Publication No. 2004-234707 (Patent Document 2) discloses a circuit configuration of ReRAM. In this ReRAM, a memory cell current is compared with a reference current by a sense amplifier, thereby determining data stored in a memory cell. In this relation, the operations of the ReRAM include read, write verify, delete verify, etc., and it is necessary to generate reference currents corresponding to these operations. Thus, a plurality of kinds of reference currents must be generated.

For example, the configuration in FIG. 4 of Patent Document 2 uses a reference cell having four circuits in each of which a fixed resistance element and a cell transistor are serially connected to each other. By selecting a desired one of the cell transistors, a reference current corresponding to the resistance value of the selected circuit is generated. As the fixed resistance elements of the reference cell, used generally are polysilicon resistance elements as shown in Wataru Otsuka et al., "A 4 Mb Conductive-Bridge Resistive Memory with 2.3 GB/s Read-Throughput and 216 MB/s Program Throughput," 2011 IEEE International Solid-State Circuits Conference Digest of Technical Papers, February 2011, P210-211.

SUMMARY

The ReRAM in Patent Document 2 has however the following problems. To state concretely, in order to generate a plurality of kinds of reference currents in ReRAM, it is necessary to place a plurality of fixed resistance elements different in resistance value in a reference cell, or place a plurality of reference cells. Also, while polysilicon resistance elements are used as the fixed resistance elements as described above, the sheet resistance value of a general polysilicon resistance element is of the order of several hundreds of ohms to one kiloohm. Therefore, in order to form a plurality of fixed resistance elements large in resistance value using such polysilicon resistance elements, a large number of polysilicon resistance elements are necessary. This increases the circuit area of the ReRAM. Moreover, in generating a plurality of kinds of reference currents using polysilicon resistance elements, there is a limit to the extent to which the step width of the reference currents is reduced. In other words, it is difficult to finely control the reference currents.

According to a nonvolatile semiconductor memory device of the present disclosure, the circuit area can be reduced, and also the reference currents can be finely adjusted.

An example nonvolatile semiconductor memory device includes: a memory cell array having a plurality of memory cells each including a nonvolatile semiconductor memory element arranged in a matrix; a plurality of word lines placed in one-to-one correspondence with rows of the memory cell array and each connected in common to a plurality of memory cells arranged in a corresponding one of the rows; a plurality of bit lines placed in one-to-one correspondence with columns of the memory cell array and each connected in common to a plurality of memory cells arranged in a corresponding one of the columns; a plurality of source lines; a reference bit line; a reference source line; at least one reference cell including first and second transistors serially connected between the reference bit line and the reference source line; a reference word line connected to a gate of the first transistor of the reference cell; and a reference driver circuit configured to control a gate voltage of the second transistor of the reference cell.

According to the above example nonvolatile semiconductor memory device, the reference cell includes the serially connected first and second transistors, and these transistors are connected between the reference bit line and the reference source line. The reference word line is connected to the gate of the first transistor, and the gate voltage of the second transistor is controlled by the reference driver circuit. That is, in the reference cell, the first transistor operates as a selective transistor. By contrast, the second transistor operates as a variable resistance element since the on-resistance value of the second transistor varies by adjusting the gate voltage thereof.

When a voltage is applied to the reference bit line, for example, a current pathway through the reference bit line, the reference cell, and the reference source line is formed. Since the resistance value of this current pathway varies with the gate voltage of the second transistor, it can be controlled finely by finely adjusting the output voltage of the reference driver circuit. Thus, the current flowing in the current pathway, i.e., the reference current can be controlled with fine resolution. Also, since the fine adjustment of the reference current is possible with one reference cell, the circuit area of the nonvolatile semiconductor device can be reduced.

Another example nonvolatile semiconductor memory device includes: a memory cell array having a plurality of memory cells each including a nonvolatile semiconductor memory element arranged in a matrix; a plurality of word lines placed in one-to-one correspondence with rows of the memory cell array and each connected in common to a plurality of memory cells arranged in a corresponding one of the rows; a plurality of bit lines placed in one-to-one correspondence with columns of the memory cell array and each connected in common to a plurality of memory cells arranged in a corresponding one of the columns; a reference bit line; a reference word line, at least one reference cell including a transistor connected between the reference bit line and the reference word line; and a reference driver circuit configured to control a gate voltage of the transistor of the reference cell.

According to the above example nonvolatile semiconductor memory device, the reference cell includes the transistor, and the transistor is connected between the reference bit line and the reference word line. Since the gate voltage of the transistor is controlled by the reference driver circuit, the transistor operates as a variable resistance transistor. When a voltage is applied to the reference bit line, a current pathway through the reference bit line, the reference cell, and the reference word line is formed.

Since the resistance value of the current pathway varies with the gate voltage of the transistor, it can be controlled finely by finely adjusting the output voltage of the reference driver circuit. Thus, the current flowing in the current pathway, i.e., the reference current can be controlled with fine resolution. Also, since the fine adjustment of the reference current is possible with one reference cell, the circuit area of the nonvolatile semiconductor device can be reduced.

DETAILED DESCRIPTION

First Embodiment

Figure 1:
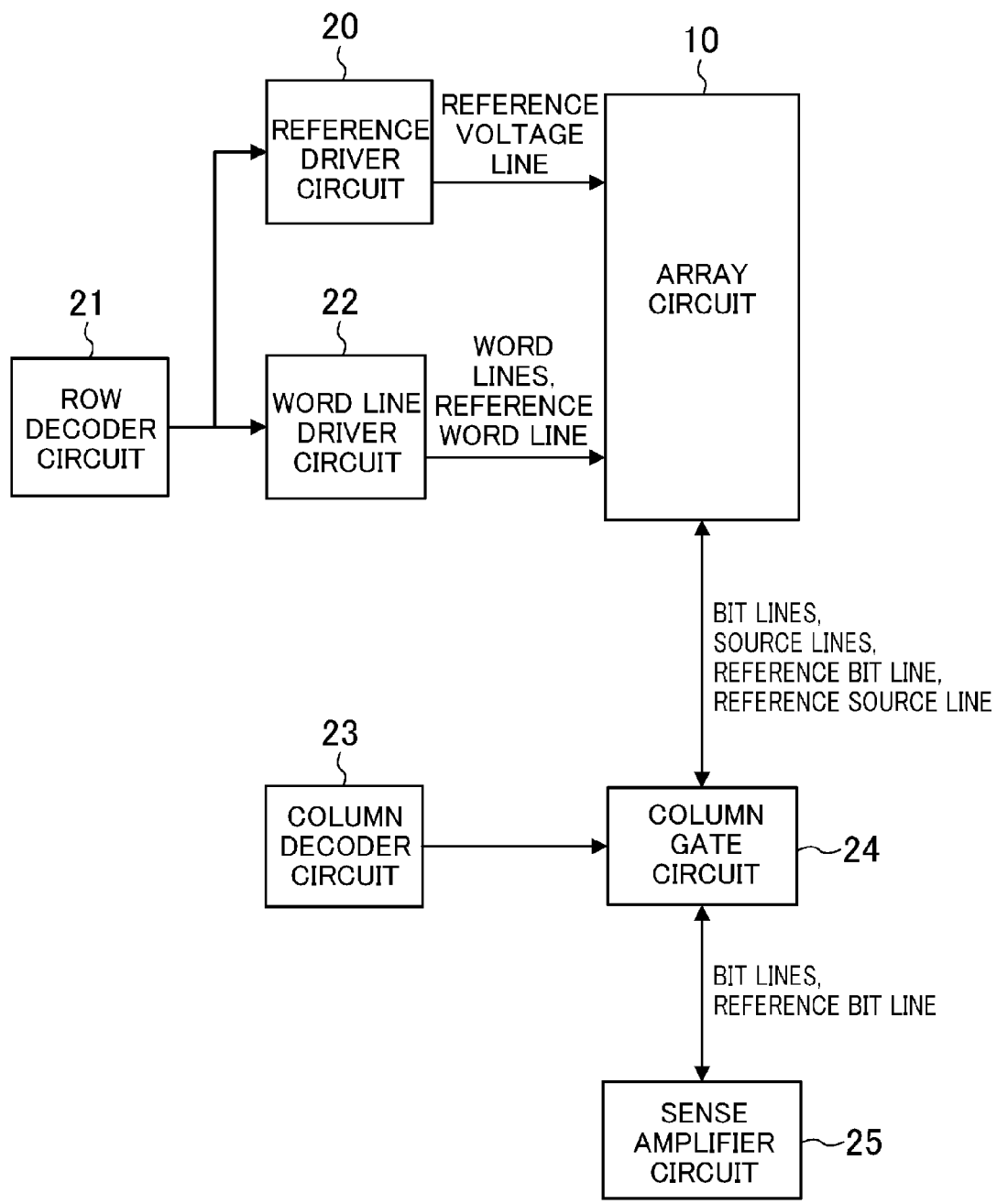
FIG. 1 is a block diagram showing the entire configuration of a nonvolatile semiconductor memory device according to the first embodiment.

FIG. 1 is a block diagram showing the entire configuration of a nonvolatile semiconductor memory device according to the first embodiment. The nonvolatile semiconductor memory device includes an array circuit 10, a reference driver circuit 20, a row decoder circuit 21, a word line driver circuit 22, a column decoder circuit 23, a column gate circuit 24, and a sense amplifier circuit 25.

The array circuit 10 is connected to its peripheral circuits via a plurality of word lines, a plurality of bit lines, a plurality of source lines, a reference word line, a reference bit line, a reference source line, and a reference voltage line. A plurality of memory cells and a reference cell are arranged in the array circuit 10. Details of the array circuit 10 will be described later.

The reference driver circuit 20, connected to the reference cell via the reference voltage line, controls the voltage supplied to the reference voltage line.

The row decoder circuit 21 controls the word line driver circuit 22 so as to drive the reference word line and a word line specified by an input address signal. The row decoder circuit 21 also instructs the reference driver circuit 20 to output the voltage. The word line driver circuit 22 drives the reference word line and the word lines according to the output of the row decoder circuit 21.

The column decoder circuit 23 controls the column gate circuit 24 so as to select a bit line and a source line specified by an input address signal.

Between the column gate circuit 24 and the array circuit 10, the bit lines, the source lines, the reference bit line, and the reference source line are wires so that the wiring loads of the bit lines and the reference bit line, and those of the source lines and the reference source line, are approximately equal to each other. The column gate circuit 24 selects any one of the bit lines according to the output of the column decoder circuit 23 and connects the selected bit line to the sense amplifier circuit 25. The column gate circuit 24 also connects the reference bit line to the sense amplifier circuit 25. Although not shown, the column gate circuit 24 is provided with circuits that ground the bit lines, the source lines, and the reference source line.

The sense amplifier circuit 25 compares currents flowing in the bit line and the reference bit line with each other when reading data from a memory cell in the array circuit 10, and determines whether the read data is "1" or "0."

Figure 2:
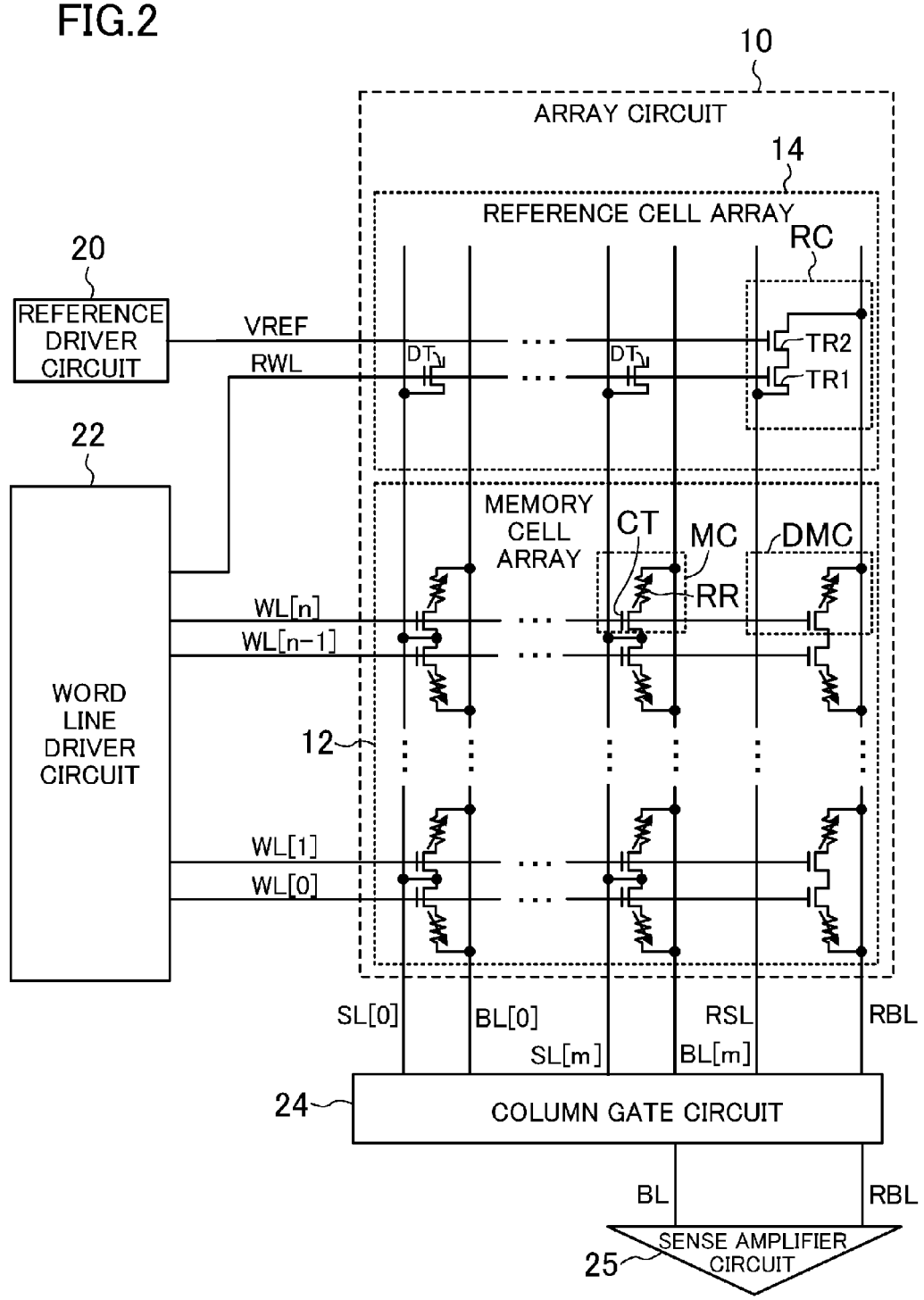
FIG. 2 is a circuit diagram showing details of an array circuit and its peripheral circuits according to the first embodiment.

FIG. 2 is a circuit diagram showing details of the array circuit and its peripheral circuits according to the first embodiment.

As shown in FIG. 2, the array circuit 10 includes a memory cell array 12, a reference cell array 14, a plurality of word lines WL[0] to WL[n] (simply referred to as WL as appropriate), a plurality of bit lines BL[0] to BL[m] (simply referred to as BL as appropriate), a plurality of source lines SL[0] to SL[m] (simply referred to as SL as appropriate), a reference word line RWL, a reference bit line RBL, and a reference source line RSL. Note that n and m are natural numbers.

The memory cell array 12 has a plurality of memory cells MC arranged in a matrix in each of which a variable resistance element RR is used as a nonvolatile semiconductor memory element. The memory cells MC are so-called 1T1R memory cells each comprises variable resistance element RR and a cell transistor CT as the third transistor.

The word lines WL are placed in one-to-one correspondence with the rows of the memory cell array 12. Each word line WL is connected in common to the gates of the cell transistors CT of a plurality of memory cells MC arranged in the same row.

The bit lines BL and the source lines SL are placed in one-to-one correspondence with the columns of the memory cell array 12. Each bit line BL is connected in common to the variable resistance elements RR of a plurality of memory cells MC arranged in the same column Each source line SL is connected in common to the sources of the cell transistors CT of a plurality of memory cells MC arranged in the same column.

The reference bit line RBL and the reference source line RSL are placed to extend in the same direction as the bit lines BL and the source lines SL. In the memory cell array 12, dummy memory cells DMC connected to the reference bit line RBL are arranged. The dummy memory cells DMC are configured similarly to the memory cells MC, but the sources of cell transistors thereof are not connected to the reference source line RSL. In other words, the dummy memory cells DMC are not used for data storage but are provided to make the wiring capacitances of the reference bit line RBL and the bit lines BL identical to each other.

The reference cell array 14, placed to be adjacent to the memory cell array 12 in the column direction of the memory cell array 12, includes a reference cell RC, a reference voltage line VREF, and the reference word line RWL. Note that the memory cell array 12 and the reference cell array 14 are not necessarily required to be adjacent to each other.

The reference cell RC comprises a selective transistor TR1 (hereinafter simply referred to as a transistor TR1) and a variable resistance transistor TR2 (hereinafter simply referred to as a transistor TR2) serially connected to each other. The reference word line RWL is connected to the gate of the transistor TR1, and the reference source line RSL is connected to the source thereof. The reference voltage line VREF is connected to the gate of the transistor TR2, and the reference bit line RBL is connected to the drain thereof.

In the reference cell RC configured as described above, the transistor TR1, which is on/off controlled by the word line driver circuit 22, operates as a selective transistor. The transistor TR2, the gate voltage of which is controlled with the output voltage of the reference driver circuit 20, operates as a variable resistance element. Therefore, when a voltage is supplied to the reference bit line RBL, for example, from the sense amplifier circuit 25, a current pathway connecting the reference bit line RBL, the transistors TR2 and TR1, and the reference source line RSL is formed, and a reference current corresponding to the resistance value of the transistor TR2 flows in this current pathway. Thus, since the gate voltage of the transistor TR2 is controlled by the reference driver circuit 20 causing the resistance value of the reference cell RC to vary, the reference current can be adjusted. The gate voltage of the transistor TR2 is controlled in the range of about 0.5 V to 3.3 V, for example.

It is preferable that the transistor TR1, which operates as a selective transistor, be in the same shape as the cell transistors CT of the memory cells MC. Specifically, the gate oxide film thickness of the transistor TR1 should be identical to that of the cell transistors CT. Alternatively, the gate channel length and gate channel width of the transistor TR1 should be identical to those of the cell transistors CT.

As for the transistor TR2, which operates as a variable resistance element, the gate oxide film thickness, the gate channel length, the gate channel width, etc. should be designed according to the characteristics required for the reference cell RC such as the range of the reference current to be generated. Since voltages in a wide range are used for the reference voltage line VREF compared with for the word lines WL and the reference word line RWL, the rise time of the transistor TR2 when a voltage is supplied to the reference voltage line VREF from the off state varies with the voltage value. Therefore, to shorten the read time of the reference current, it is desirable to turn on/off the transistor TR1 while constantly applying a voltage to the reference voltage line VREF. The rise time of the transistor TR1 can be the same as that of the cell transistors CT by giving the same characteristics to the transistor TR1 and the cell transistors CT and applying the same voltage to the reference word line RWL and the word lines WL.

Note that the gate oxide film thickness of the transistor TR2 may be identical to that of the cell transistors CT. Also, the gate channel length and gate channel width of the transistor TR2 may be identical to those of the cell transistors CT.

As described above, by giving the same transistor characteristics to the memory cells MC and the reference cell RC, the precision of the cell current and the reference current can be kept in a high level.

In order to make the wiring capacitances of the reference word line RWL and the word lines WL be identical to each other, dummy transistors DT may be connected to the reference word line RWL, in addition to the transistor TR1. The gates of the dummy transistors DT are connected to the reference word line RWL, the sources thereof are connected to the source lines SL, and the drains thereof are open. The dummy transistors DT are in the same shape as the cell transistors CT of the memory cells MC. That is, it is preferable that the gate oxide film thickness, the gate channel length, and the gate channel width of the dummy transistors DT be identical to those of the cell transistors CT.

Figure 3:
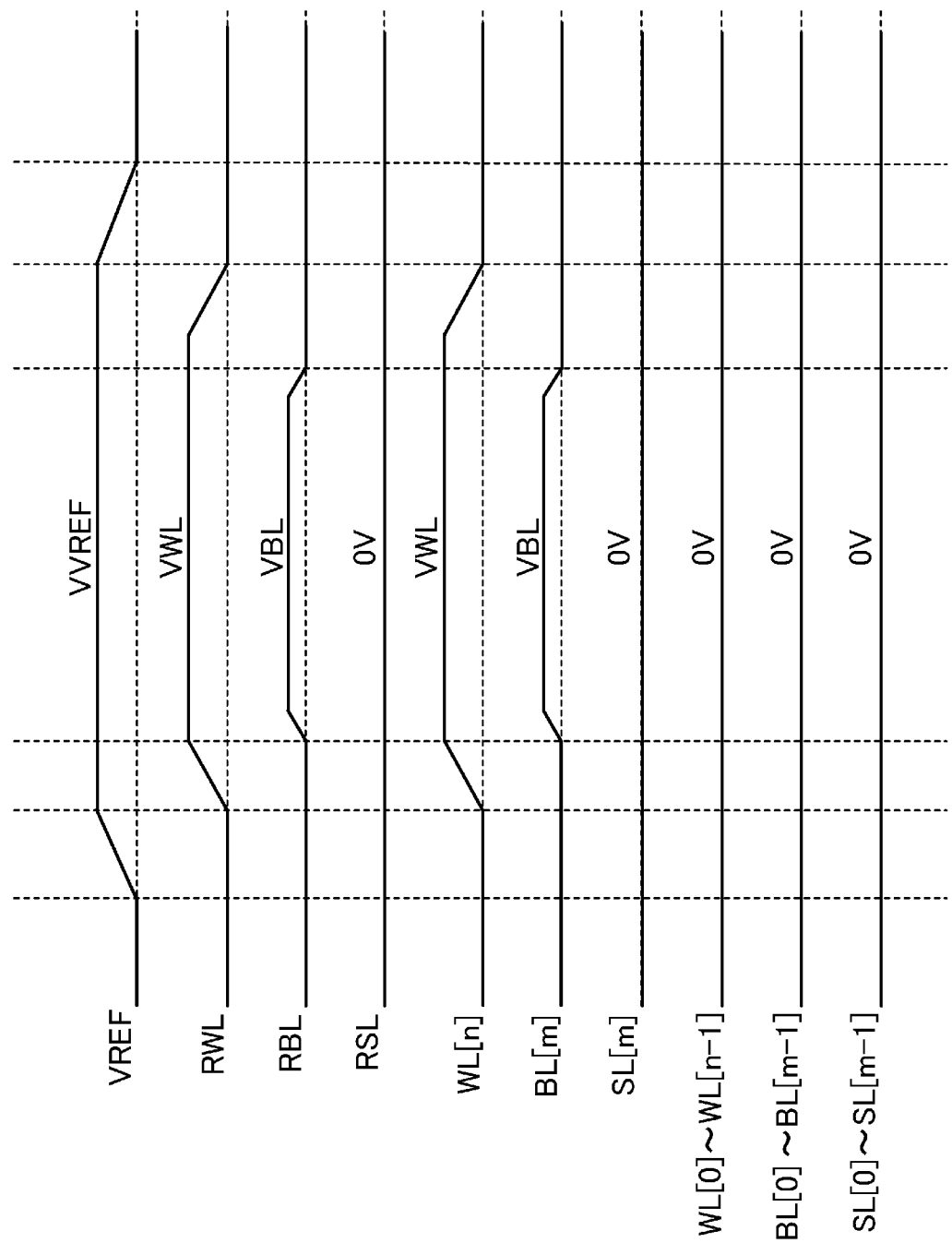
FIG. 3 is a waveform chart of voltages applied to interconnects when data is read from the array circuit in FIG. 2.

Next, read operation using the array circuit 10 according to this embodiment will be described with reference to FIG. 3. FIG. 3 is a waveform chart of voltages applied to the interconnects when data is read from the array circuit in FIG. 2. Note that the case of reading data from the selected memory cell MC connected to the bit line BL[m], the source line SL[m], and the word line WL[n] will be described hereinafter.

First, a voltage VVREF as a predetermined voltage is applied to the reference voltage line VREF from the reference driver circuit 20. With this, the on-resistance value of the transistor TR2 changes according to the voltage VVREF.

A voltage VWL as a predetermined voltage is applied to the selected word line WL[n] and the reference word line RWL from the word line driver circuit 22. This turns on the transistor TR1 and the cell transistor CT of the selected memory cell MC.

Thereafter, the selected source line SL[m] and the reference source line RSL are grounded in the column gate circuit 24, and the selected bit line BL[m] and the reference bit line RBL are connected to the sense amplifier circuit 25. A voltage VBL as a predetermined voltage is then applied from the sense amplifier circuit 25 to the selected bit line BL[m] and the reference bit line RBL. This causes flow of a cell current in the selected bit line BL[m] and a reference current in the reference bit line RBL. The current amounts of these currents vary with the resistance values of the selected memory cell MC and the reference cell RC. The sense amplifier circuit 25 determines the difference between the current amounts, whereby data can be read from the selected memory cell MC. When the read determination level is to be adjusted, the magnitude of the voltage supplied to the reference voltage line VREF, i.e., the voltage VVREF, should be changed. This changes the on-resistance value of the transistor TR2, and thus the reference current can be adjusted.

In the read operation described above, the bit lines other than the selected bit line BL[m], i.e., BL[0] to BL[m−1], the selected source line SL[m], and the source lines SL[0] to SL[m−1] are grounded in the column gate circuit 24. Also, the word lines other than the selected word line WL[n], i.e., WL[0] to WL[n−1], are grounded in the word line driver circuit 22.

According to this embodiment, the gate voltage of the transistor TR2 of the reference cell RC can be controlled finely by the reference driver circuit 20, thereby permitting fine adjustment of the reference current. Moreover, since the reference current can be controlled with high precision with one reference cell RC, the circuit area of ReRAM can be reduced.

In the reference cell RC, when the characteristics of the transistors TR1 and TR2 vary with process variations, etc., the characteristics of the reference cell RC will also vary. In particular, the transistor TR2 of the reference cell RC tends to vary more largely than the variable resistance element RR of the memory cell MC. For this reason, in order to keep the reference current generated in the reference cell RC at high precision, it is necessary to correct the difference. In this embodiment, where the voltage at the reference voltage line VREF can be adjusted dynamically in response to the state of the variations in the characteristics of the transistor TR2, the variations can be easily corrected.

The verify operation during write and delete for the memory cell MC is similar to the read operation. In the verify operation, a predetermined voltage for write verify or delete verify may be used as the voltage supplied to the reference voltage line VREF. With this voltage application, the resistance value of the transistor TR2 can be adjusted to a value suitable for the operation, and thus a reference current required for the operation can be generated.

In this embodiment, also, since the voltage supplied to the reference voltage line VREF can be controlled dynamically, the device characteristics of the memory cell array 12 can be easily obtained as will be described hereinafter.

Specifically, the voltage VVREF supplied to the reference voltage line VREF is set to a first level, and the above-described read operation is executed for all the memory cells MC of the memory cell array 12. Once the read operation for all the memory cells MC has been completed, the voltage VVREF is set to a second level higher than the first level, and the read operation is again executed for all the memory cells MC. When the read operation is repeated in this way with the voltage VVREF being increased stepwise, there arises a phenomenon that data read from a given memory cell MC is inverted.

The reason for the above is as follows. The memory cell current of the given memory cell MC is larger than the reference current before the occurrence of the phenomenon. However, the resistance value of the reference cell RC gradually decreases with the gradual increase in the gate voltage of the transistor TR2, and thus the reference current becomes larger than the memory cell current of the memory cell MC.

Thus, the reference current of each memory cell MC can be obtained by determining the reference current based on the gate voltage of the transistor TR2 and its resistance value at the time when the data read from the memory cell MC inverts. That is to say, the distribution or variation of memory cell currents for all the memory cells MC can be measured and accounted for. In this way, the device characteristics of the memory cell array 12 can be easily obtained, and evaluation, etc. of the nonvolatile semiconductor memory device can be performed based on the device characteristics.

Second Embodiment

Figure 4:
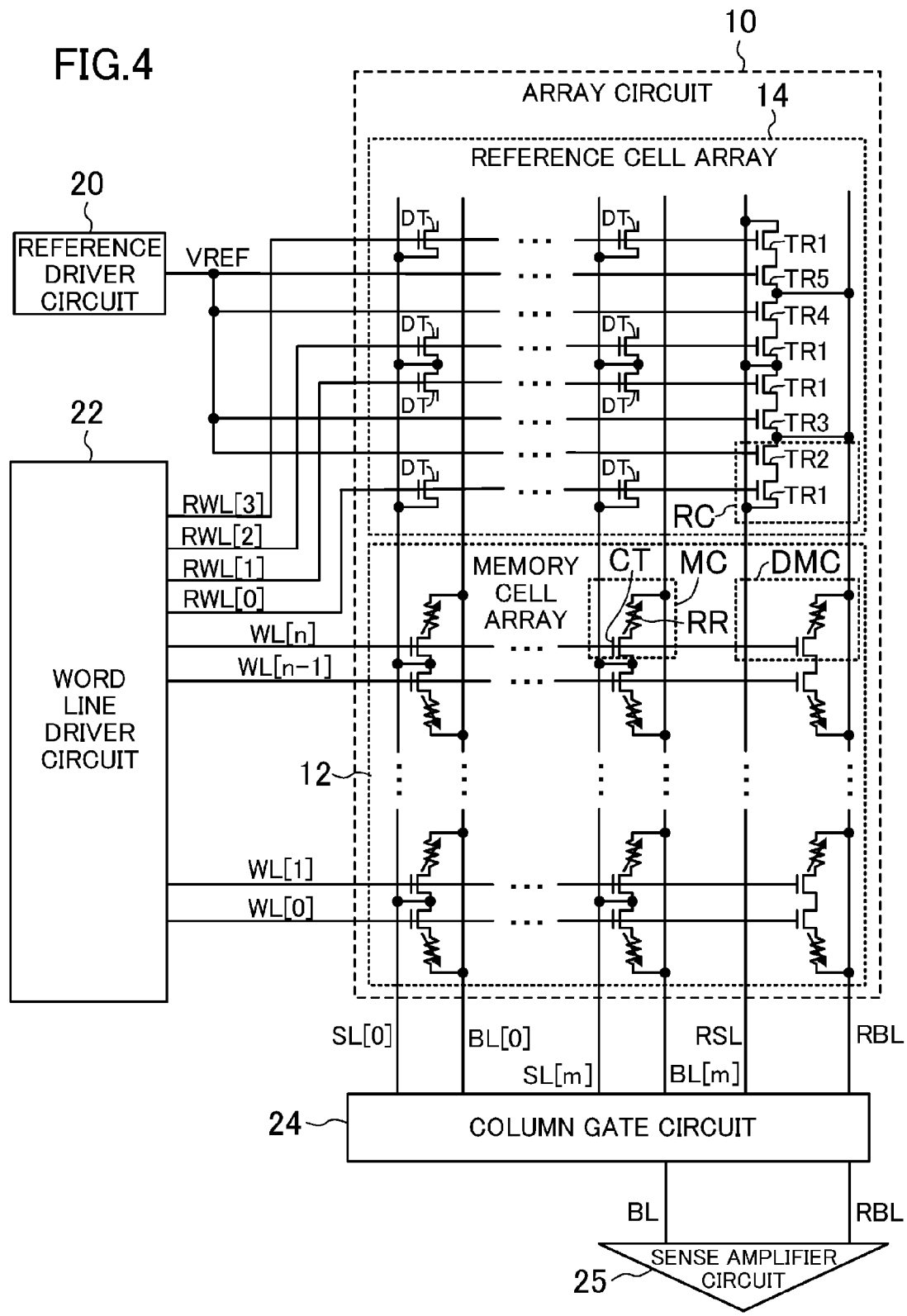
FIG. 4 is a circuit diagram showing details of an array circuit and its peripheral circuits according to the second embodiment.

FIG. 4 is a circuit diagram showing details of the array circuit and its peripheral circuits according to the second embodiment. Note that common reference characters in FIGS. 2 and 4 denote identical components.

The reference cell array 14 in this embodiment is different from that in the first embodiment in having a plurality of reference cells RC and a plurality of reference word lines RWL[0] to RWL[3]. The points different from the first embodiment will be described hereinafter.

The plurality of reference word lines RWL[0] to RWL[3] are connected to the gates of the transistors TR1 of the corresponding reference cells RC. The gates of dummy transistors DT arranged in the same row are connected to each of the reference word lines RWL[0] to RWL[3].

The reference bit line RBL is connected in common to the drains of the transistors TR2 to TR5 of the reference cells RC. With the gates connected to the reference voltage line VREF, the transistors TR2 to TR5 are transistors functioning as variable resistance elements. The reference source line RSL is connected in common to the sources of the transistors TR1 of the reference cells RC.

In this embodiment, using a plurality of reference cells RC, different reference cells RC can be used for the read operation, the verify operation during write, and the verify operation during delete, for example. Thus, in order to generate reference currents required for these operations, the characteristics of the transistors TR2 to TR5 of the reference cells RC can be optimized individually by changing the sizes of these transistors, for example. That is, with the plurality of reference cells RC, it is possible to generate reference currents that can cover a wider range with higher precision. Alternatively, two or more of the reference word lines RWL [0] to RWL[3] may be made selectable simultaneously, to change the current to a reference current required for each operation. The transistor sizes of the transistors TR2 to TR5 may be identical to one another.

While four reference cells RC are shown in FIG. 4, the number of reference cells RC is arbitrary.

Figure 5:
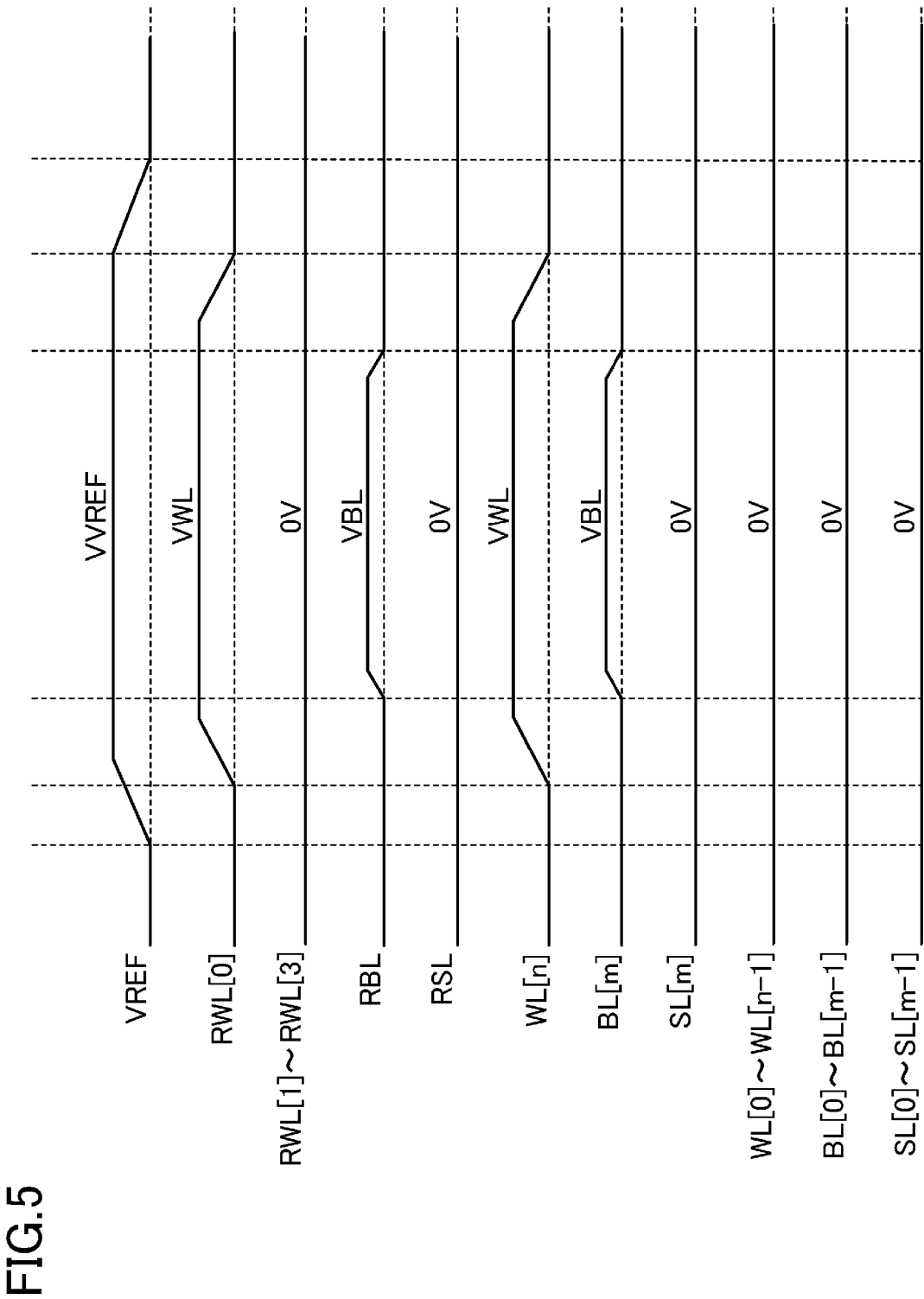
FIG. 5 is a waveform chart of voltages applied to interconnects when data is read from the array circuit in FIG. 4.

Next, the read operation using the array circuit 10 according to this embodiment will be described with reference to FIG. 5. FIG. 5 is a waveform chart of voltages applied to the interconnects when data is read from the array circuit in FIG. 4. Note that the same memory cell as that used in the first embodiment will be used as the selected memory cell MC and the reference cell connected to the reference word line RWL [0] will be used as the selected reference cell RC.

First, a voltage VVREF as a predetermined voltage is applied to the reference voltage line VREF from the reference driver circuit 20. This causes changes of the on-resistance values of the transistors TR2 to TR5 of the reference cells RC according to the voltage VVREF.

A voltage VWL as a predetermined voltage is applied to the selected word line WL[n] and the selected reference word line RWL[0] from the word line driver circuit 22. This turns on the transistor TR1 of the selected reference cell RC and the cell transistor CT of the selected memory cell MC.

Thereafter, the selected source line SL[m] is grounded in the column gate circuit 24, and the selected bit line BL[m] and the reference bit line RBL are connected to the sense amplifier circuit 25. A voltage VBL as a predetermined voltage is then applied to the selected bit line BL[m] and the reference bit line RBL from the sense amplifier circuit 25. This causes flow of a cell current in the selected bit line BL[m] and a reference current in the reference bit line RBL. The current amounts of these currents vary with the resistance values of the selected memory cell MC and the selected reference cell RC. The sense amplifier circuit 25 determines the difference between the current amounts, whereby data can be read from the selected memory cell MC.

In the read operation in this embodiment, the reference word lines other than the selected reference word line RWL[0], i.e., RWL[1] to RWL[3], are grounded in the word line driver circuit 22.

As described above, in this embodiment, where the characteristics of the transistors TR2 to TR5 of the reference cells RC can be set individually according to the operations, etc., it is possible to generate reference currents in a wider range with higher precision. Since the number of reference cells RC arranged in the array circuit 10 can be small, increase in the circuit area of the ReRAM can be suppressed.

In this embodiment, the operation related to the distribution measurement described in the first embodiment is performed with the reference word line RWL[0] kept selected, for example, and this operation is repeated every time the selection of the reference word lines RWL[0] to RWL[3] is changed. In this way, the device characteristics of the memory cell array 12 can be obtained more precisely.

Third Embodiment

Figure 6:
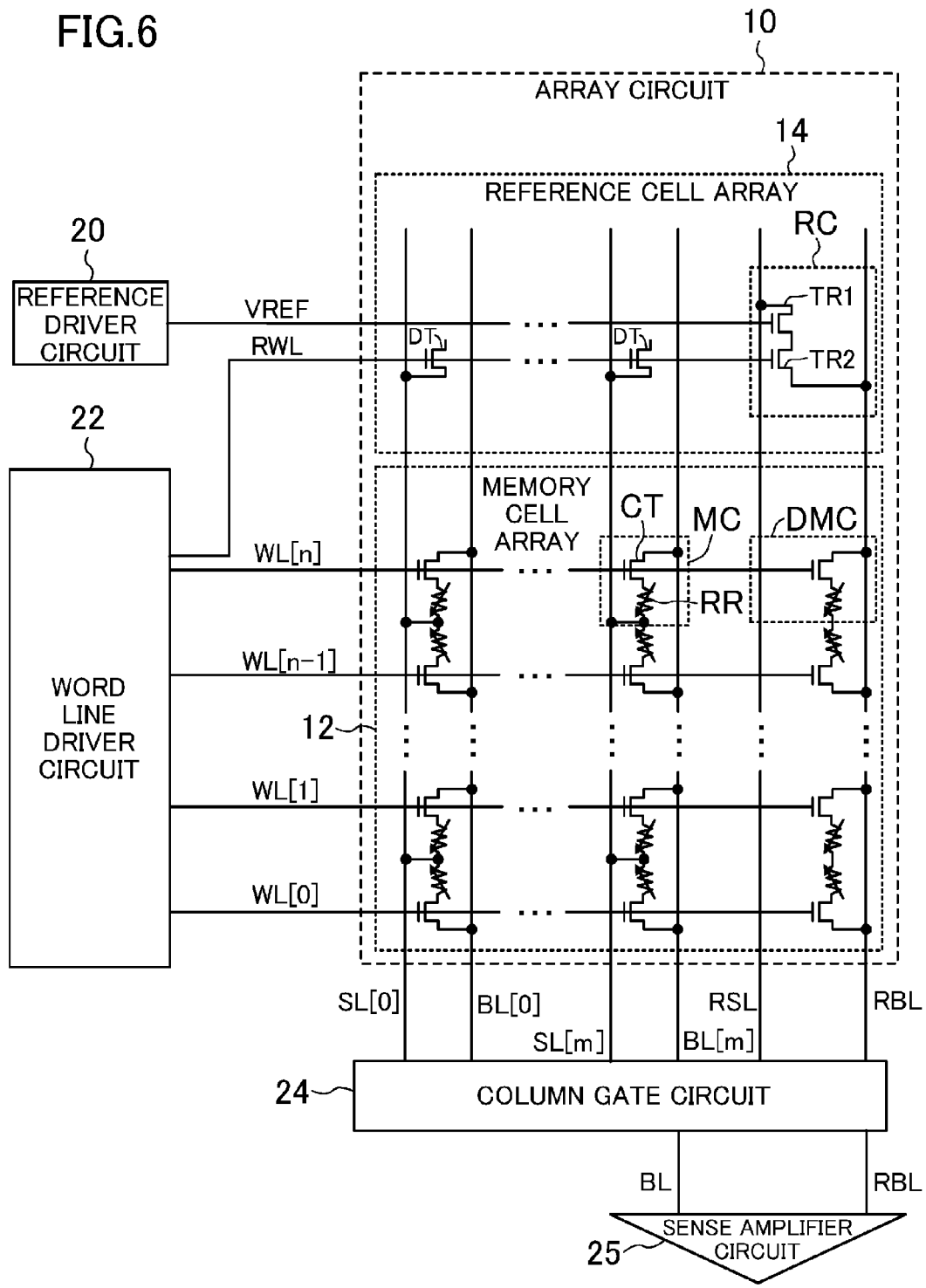
FIG. 6 is a circuit diagram showing details of an array circuit and its peripheral circuits according to the third embodiment.

FIG. 6 is a circuit diagram showing details of the array circuit and its peripheral circuits according to the third embodiment. Note that common reference characters in FIGS. 2 and 6 denote identical components, and thus only points different from FIG. 2 will be described.

In this embodiment, each bit line BL is connected in common to the drains of cell transistors CT in the same column, and each source line SL is connected in common to variable resistance elements RR in the same column In the reference cell RC, the source of the transistor TR1 is connected to the reference source line RSL, and the gate voltage thereof is controlled by the reference driver circuit 20. The drain of the transistor TR2 is connected to the reference bit line RBL, and the gate thereof is connected to the reference word line RWL. That is, in the reference cell RC, the transistor TR1 operates as a variable resistance element, and the transistor TR2 operates as a selective transistor.

With this configuration of the array circuit 10, also, similar advantages to those in the first embodiment can be obtained.

Fourth Embodiment

Figure 7:
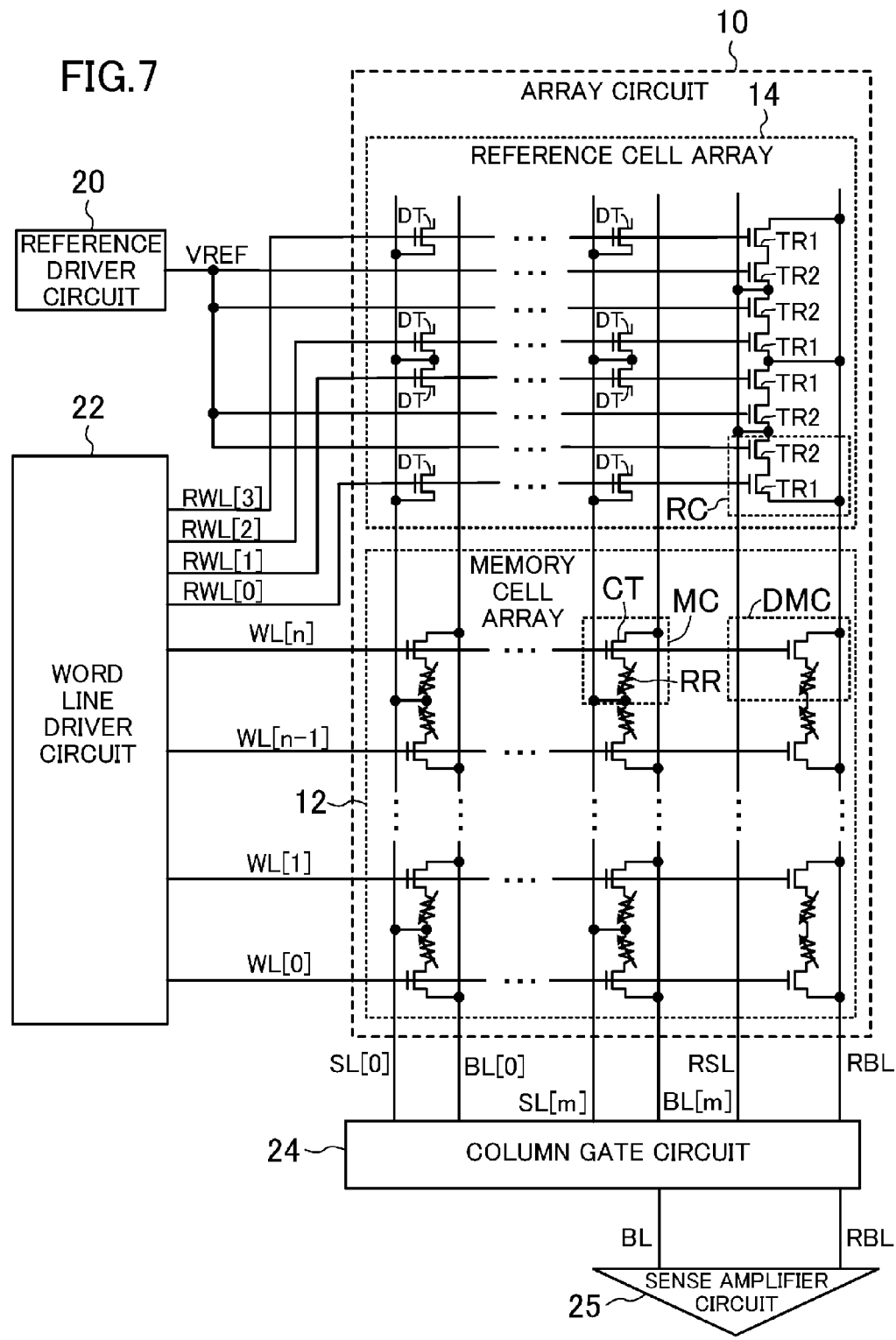
FIG. 7 is a circuit diagram showing details of an array circuit and its peripheral circuits according to the fourth embodiment.

FIG. 7 is a circuit diagram showing details of the array circuit and its peripheral circuits according to the fourth embodiment. Note that common reference characters in FIGS. 4 and 7 denote identical components, and thus only points different from FIG. 4 will be described.

In this embodiment, each bit line BL is connected in common to the drains of cell transistors CT in the same column, and each source line SL is connected in common to variable resistance elements RR in the same column In each reference cell RC, the reference bit line RBL is connected to the drain of the transistor TR1, and the corresponding one of the reference word lines RWL[0] to RWL[3] is connected to the gate thereof. The reference source line RSL is connected to the source of the transistor TR2, and the reference voltage line VREF is connected to the gate thereof. That is, in each reference cell RC, the transistor TR1 operates as a selective transistor, and the transistor TR2 operates as a variable resistance element.

With this configuration of the array circuit 10, also, similar advantages to those in the second embodiment can be obtained.

Fifth Embodiment

Figure 8:
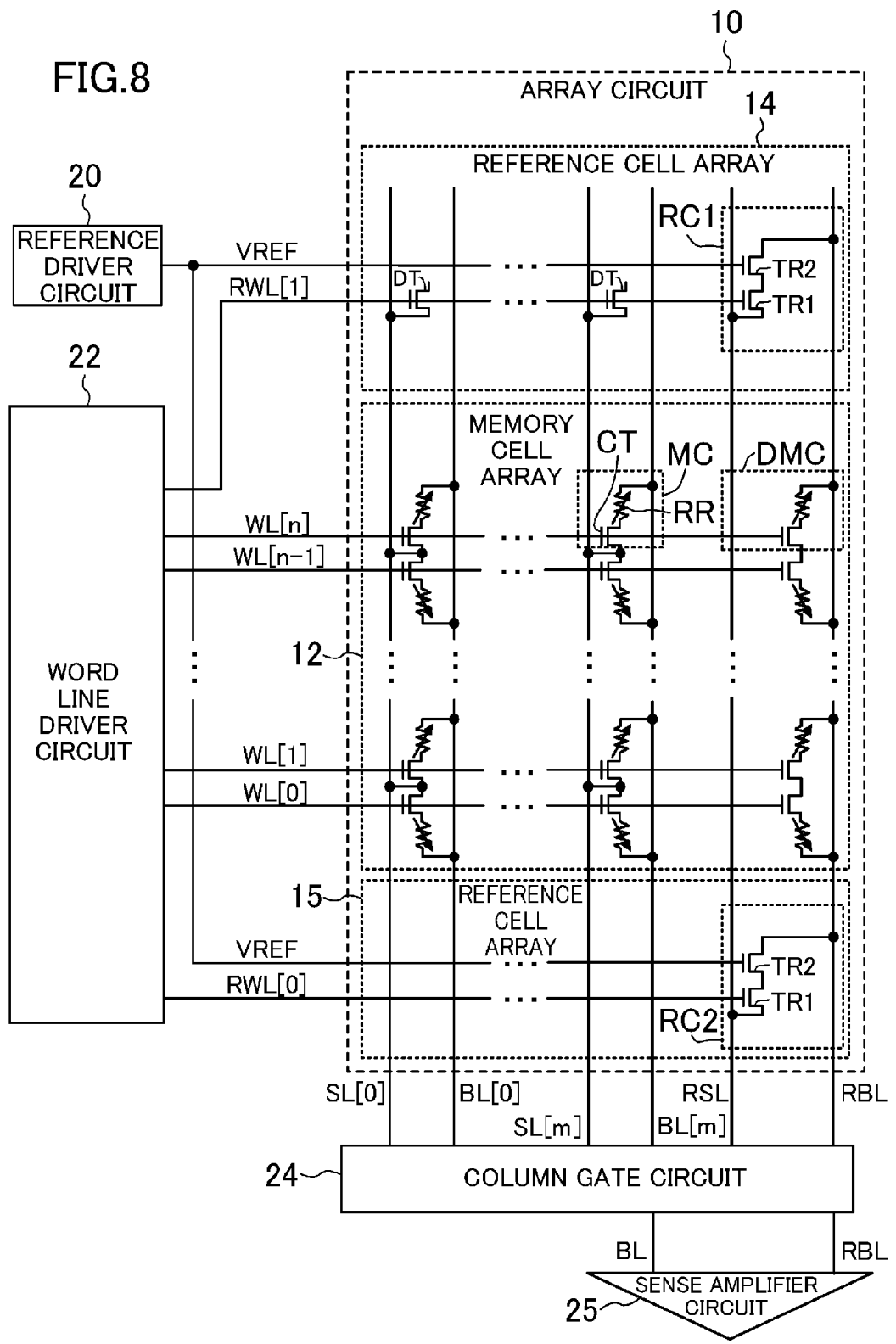
FIG. 8 is a circuit diagram showing details of an array circuit and its peripheral circuits according to the fifth embodiment.

FIG. 8 is a circuit diagram showing details of the array circuit and its peripheral circuits according to the fifth embodiment. Note that common reference characters in FIGS. 2 and 8 denote identical components, and thus only points different from FIG. 2 will be described.

The array circuit 10 includes two reference cell arrays 14 and 15, which are placed to sandwich the memory cell array 12 in the direction identical to the direction in which the bit lines BL extend.

A reference cell RC1 is placed in the reference cell array 14, and a reference cell RC2 is placed in the reference cell array 15. The reference cells RC1 and RC2 have the same configuration as the reference cell RC in FIG. 2.

In the reference cell RC1, the reference word line RWL[1] is connected to the gate of the transistor TR1, and the gate voltage of the transistor TR2 is controlled by the reference driver circuit 20.

In the reference cell RC2, the reference word line RWL[0] is connected to the gate of the transistor TR1, and the gate voltage of the transistor TR2 is controlled by the reference driver circuit 20.

In the memory cell array 12, the length of the bit line BL from the sense amplifier circuit 25 to each memory cell MC varies, and the length of the source line SL from the column gate circuit 24 to each memory cell MC varies. That is, the wiring resistances of the bit line BL and the source line SL vary with the selected memory cell MC, and this may cause a difference in the characteristics of the selected memory cell MC. To address this problem, as shown in FIG. 8, two reference cell arrays 14 and 15 are placed on the top and bottom of the memory cell array 12 in the column direction. The reference cell array 14 is used when a memory cell MC at a position away from the sense amplifier circuit 25 and the column gate circuit 24 is selected, and the reference cell array 15 is used when a memory cell MC at a position close to the sense amplifier circuit 25 and the column gate circuit 24 is selected.

With this configuration, since an influence of the wiring resistances of the bit line BL and the source line SL can be prevented or reduced, higher-precision data read can be performed.

While one reference bit line RBL and one reference source line RSL are placed in the above embodiments, a plurality of such lines each may be placed. In this case, in the read operation, the column gate circuit 24 may select one of the plurality of reference bit lines RBL and connect the selected reference bit line RBL to the sense amplifier circuit 25. Also, the reference source lines RSL may be grounded in the column gate circuit 24.

While the sources of the dummy transistors DT connected to the reference word line RWL are connected to the source lines SL in the above embodiments, they may be grounded. While the drains of the dummy transistors DT are open in the above embodiments, they may be grounded. When the drains of the dummy transistors DT are grounded, the sources thereof may be open. The dummy transistors DT may be omitted. In this case, the wiring loads of the word lines WL and the reference word lines RWL may be made equal to each other by another way.

In the above embodiments, the source lines SL may be placed to extend in parallel with the word lines WL, and the reference source line RSL in parallel with the reference word line RWL. Examples of this configuration will be described hereinafter.

Sixth Embodiment

Figure 9:
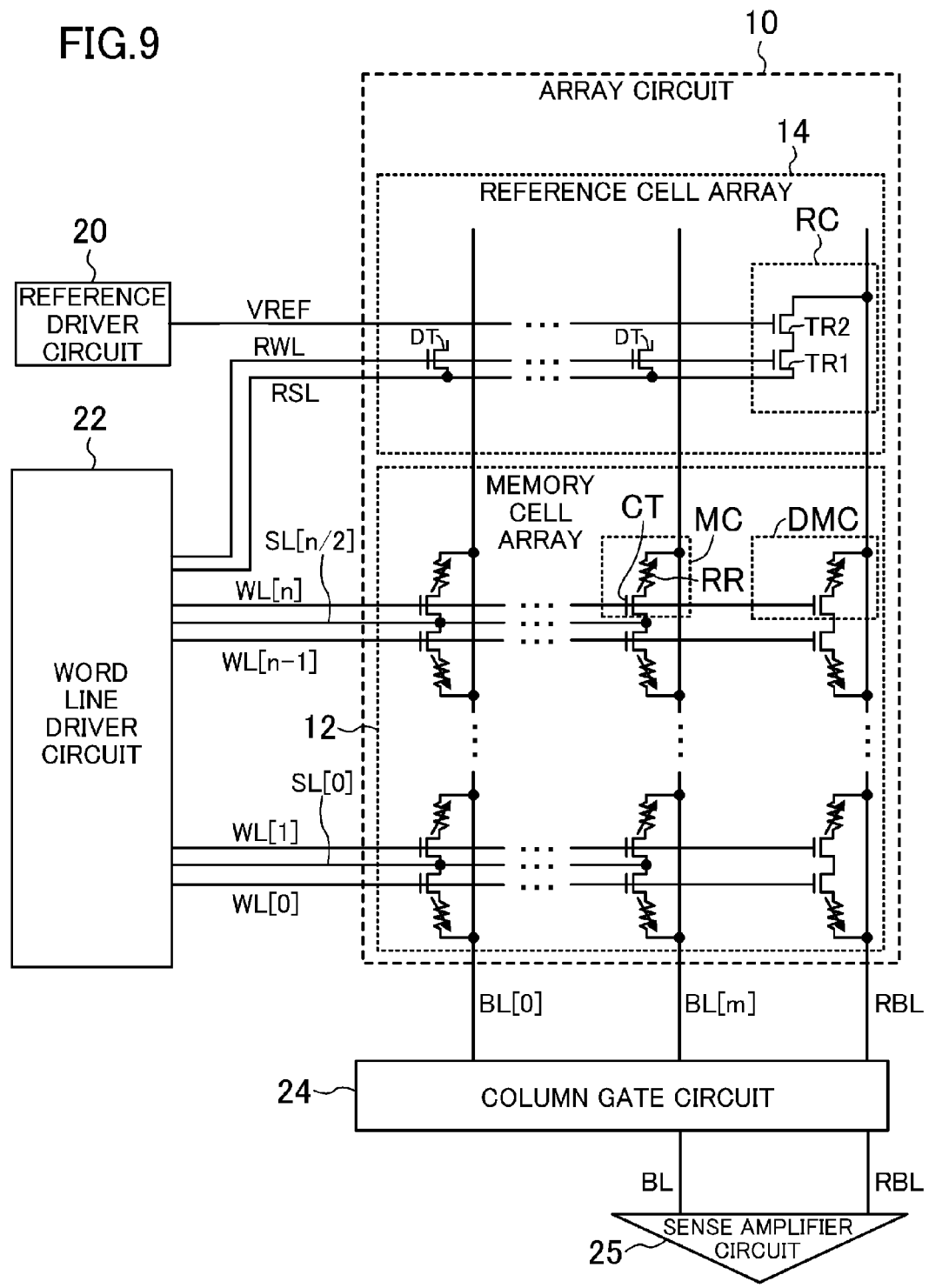
FIG. 9 is a circuit diagram showing details of an array circuit and its peripheral circuits according to the sixth embodiment.

FIG. 9 is a circuit diagram showing details of the array circuit and its peripheral circuits according to the sixth embodiment. This embodiment shows an example where the source lines SL in the configuration in FIG. 2 are placed to extend in parallel with the word lines WL and the reference source line RSL is placed to extend in parallel with the reference word line RWL. Common reference characters in FIGS. 2 and 9 denote identical components, and thus only points different from FIG. 2 will be described.

The source lines SL, extending in the row direction of the memory cell array 12, are connected in common to two memory cells MC adjacent in the column direction. The source lines SL and the reference source line RSL are connected to the word line driver circuit 22. Circuits for grounding the source lines SL and the reference source line RSL are therefore provided in the word line driver circuit 22.

In the reference cell array 14, the sources of the dummy transistors DT are connected to the reference source line RSL, and the drains thereof are open.

Seventh Embodiment

Figure 10:
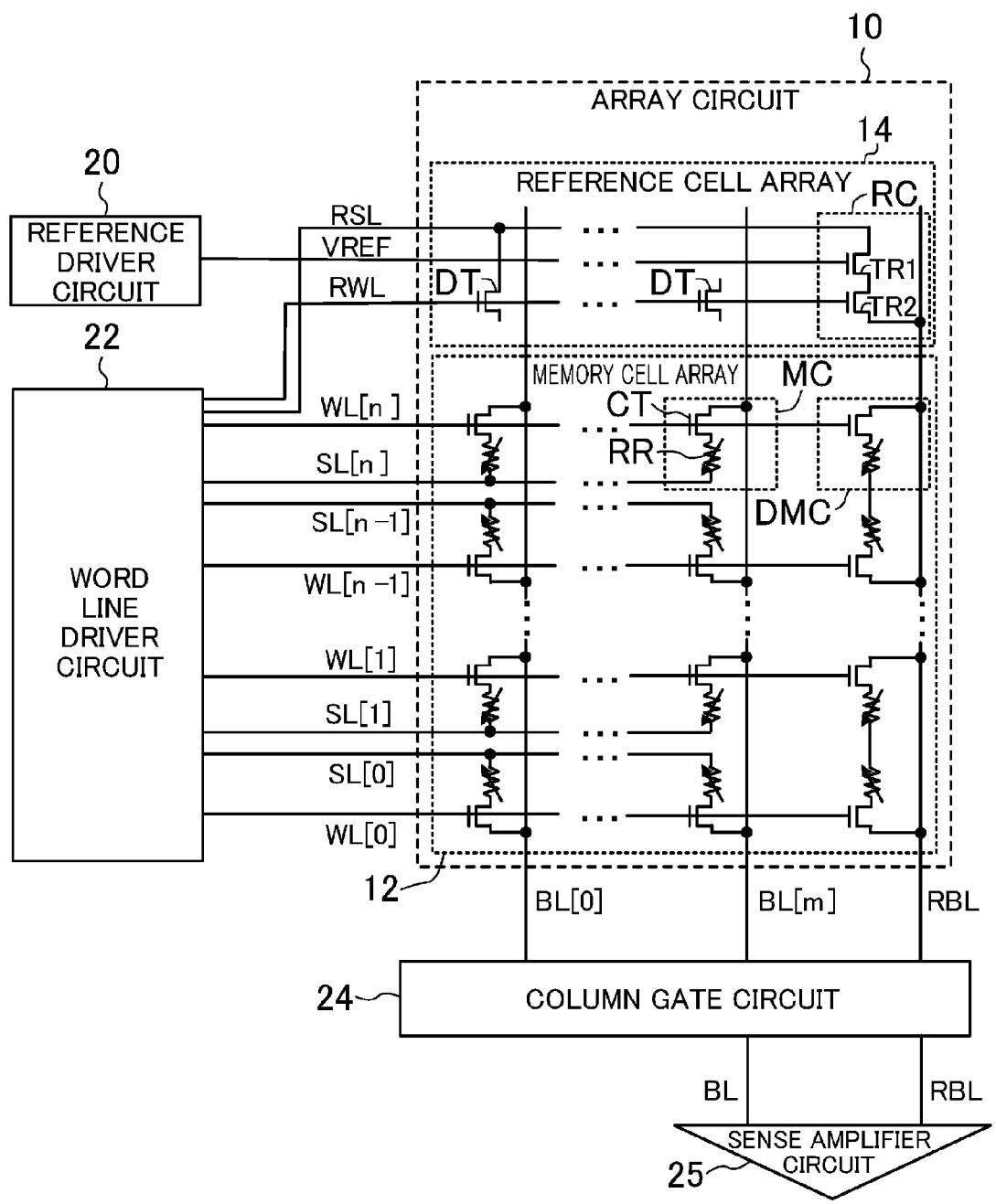
FIG. 10 is a circuit diagram showing details of an array circuit and its peripheral circuits according to the seventh embodiment.

FIG. 10 is a circuit diagram showing details of the array circuit and its peripheral circuits according to the seventh embodiment. This embodiment shows an example where the source lines SL in the configuration in FIG. 6 are placed to extend in parallel with the word lines WL and the reference source line RSL is placed to extend in parallel with the reference word line RWL. Common reference characters in FIGS. 6 and 10 denote identical components, and thus only points different from FIG. 6 will be described.

The source lines SL are placed in correspondence with the memory cells MC arranged in the row direction of the memory cell array 12, and each connected in common to the variable resistance elements RR of memory cells MC in the same column. The source lines SL and the reference source line RSL are connected to the word line driver circuit 22. Circuits for grounding the source lines SL and the reference source line RSL are therefore provided in the word line driver circuit 22.

As described above, in the sixth and seventh embodiments, also, where the source lines SL and the word lines WL are placed to extend in parallel with each other and the reference source line RSL and the reference word line RWL are placed to extend in parallel with each other, similar advantages to those in the other embodiments described above can be obtained.

While the above embodiments have been described using 1T1R memory cells as the memory cells MC, cross-point memory cells may otherwise be used. Examples of this case will be described hereinafter.

Eighth Embodiment

Figure 11:
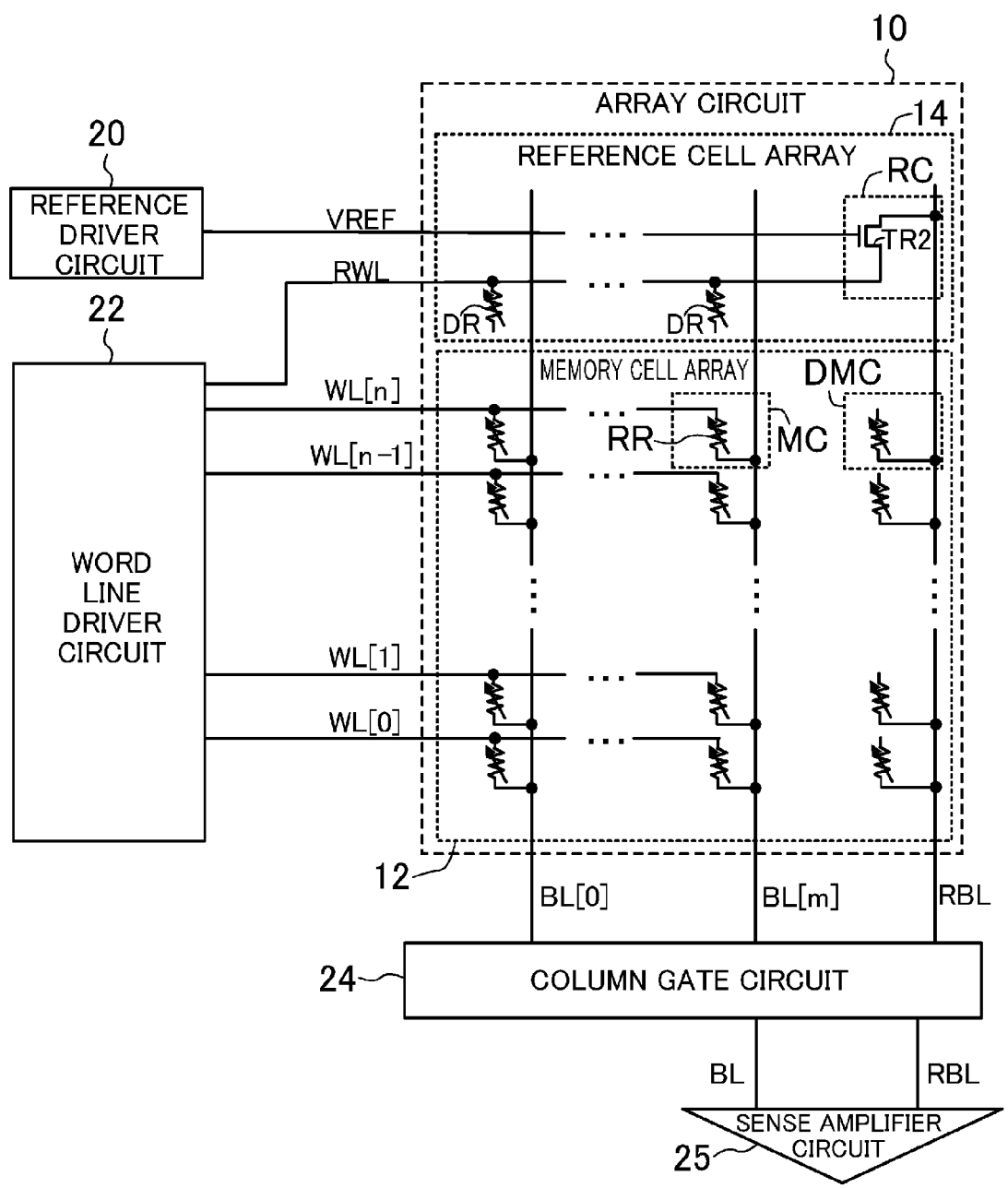
FIG. 11 is a circuit diagram showing details of an array circuit and its peripheral circuits according to the eighth embodiment.

FIG. 11 is a circuit diagram showing details of the array circuit and its peripheral circuits according to the eighth embodiment. Note that common reference characters in this embodiment and the above embodiments denote identical components.

In this embodiment, the memory cells MC arranged in a matrix are cross-point memory cells, each of which comprises one variable resistance element RR.

The word lines WL are placed in one-to-one correspondence with the rows of the memory cell array 12 and each connected to upper electrodes of variable resistance elements RR arranged in the same row.

The bit lines BL are placed in one-to-one correspondence with the columns of the memory cell array 12 and each connected to lower electrodes of variable resistance elements RR arranged in the same column.

The reference cell RC comprises one transistor TR2. The reference voltage line VREF is connected to the gate of the transistor TR2, the reference bit line RBL is connected to the drain thereof, and the reference word line RWL is connected to the source thereof.

The dummy memory cells DMC each comprise one variable resistance element. One end of the variable resistance element of each dummy memory cell DMC is connected to the reference bit line RBL, and the other end thereof is open. The characteristics of the variable resistance elements of the dummy memory cells DMC are identical to those of the variable resistance elements RR of the memory cells MC. Therefore, the wiring loads of the bit lines BL and the reference bit line RBL are approximately equal to each other.

Ends of dummy variable resistance elements DR are connected to the reference word line RWL. The dummy variable resistance elements DR are identical in characteristics to the variable resistance elements RR of the memory cells MC, and the other ends thereof are open. Therefore, the wiring loads of the word lines WL and the reference word line RWL are approximately equal to each other.

Note that the source lines SL and the reference source line RSL are unnecessary in this embodiment.

Figure 12:
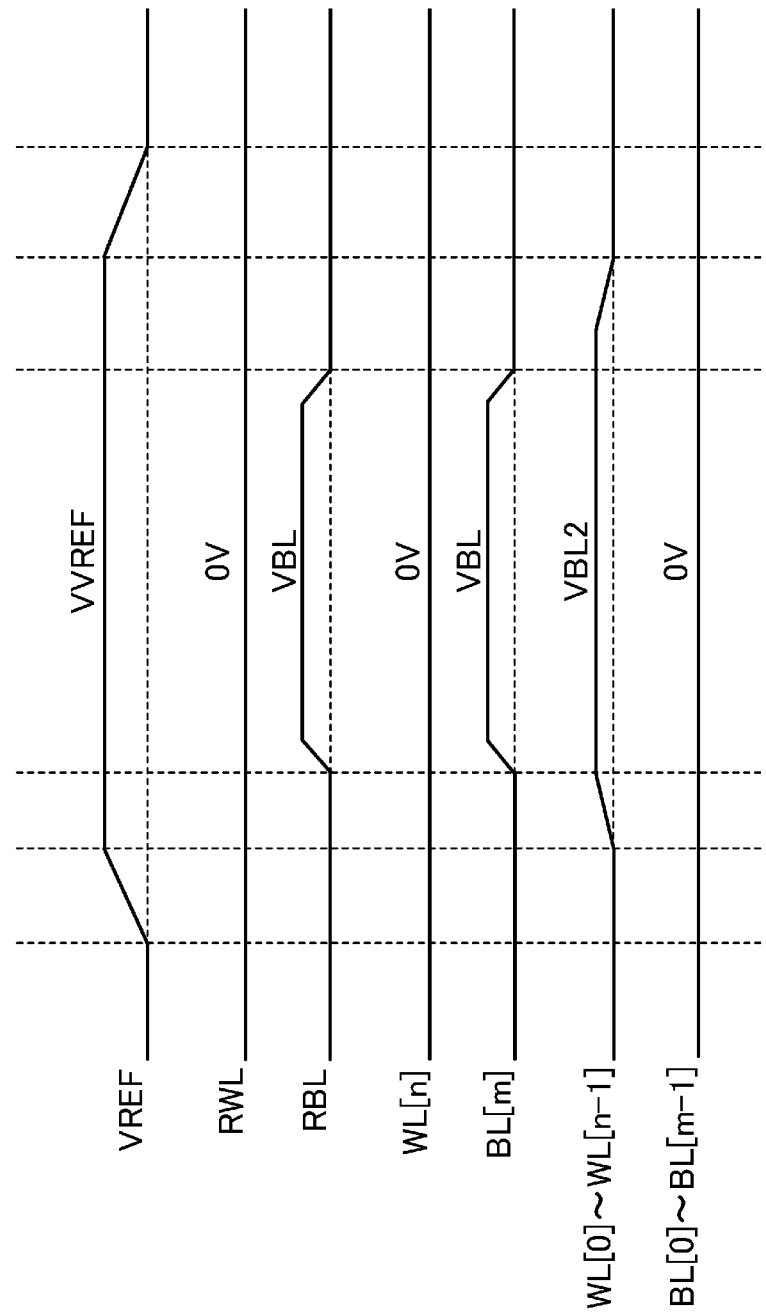
FIG. 12 is a waveform chart of voltages applied to interconnects when data is read from the array circuit in FIG. 11.

Next, the read operation using the array circuit 10 according to this embodiment will be described with reference to FIG. 12. FIG. 12 is a waveform chart of voltages applied to the interconnects when data is read from the array circuit in FIG. 11. Note that the case of reading data from the selected memory cell MC connected to the bit line BL[m] and the word line WL[n] will be described hereinafter.

First, a voltage VVREF as a predetermined voltage is applied to the reference voltage line VREF from the reference driver circuit 20.

The selected word line WL[n] and the reference word line RWL are grounded in the word line driver circuit 22. Simultaneously, a voltage VBL2 is applied to the non-selected word lines WL[0] to WL[n−1]. The voltage VBL2 is a voltage corresponding to a half of a voltage VBL described later: i.e., the magnitude of the voltage VBL2 is VBL/2 where VBL is the magnitude of the voltage VBL.

Thereafter, the voltage VBL as a predetermined voltage is applied to the selected bit line BL[m] and the reference bit line RBL. Simultaneously, the non-selected bit lines BL[0] to BL[m−1] are grounded in the column gate circuit 24. Thus, the voltage VBL having a magnitude of VBL is applied to the selected memory cell MC, and a stress having a magnitude of VBL/2 or less is applied to the non-selected memory cells.

The above causes flow of a cell current in the selected bit line BL[m] and a reference current in the reference bit line RBL. The sense amplifier circuit 25 determines the difference between these currents, whereby data in the selected memory cell MC can be read.

When the read determination level is to be adjusted, the magnitude of the voltage VVREF should be changed. This changes the on-resistance value of the transistor TR2, and thus the reference current can be adjusted.

In this embodiment, in order to perform the distribution measurement of the memory cell currents described in the first embodiment, the bit line BL[0] and the word line WL[0] are selected, and the voltage VVREF is applied to the reference voltage line VREF from the reference driver circuit 20. The read operation described above is performed, and then the selected bit line BL and the selected word line WL are sequentially changed. Once the read operation for all the memory cells MC has been completed, the voltage VVREF is increased stepwise, and the read operation for all the memory cells MC is repeated.

As described above, in this embodiment, where the memory cells MC are cross-point memory cells, no transistors are necessary in the memory cells MC. Also, with the source lines SL and the reference source line RSL being unnecessary, further reduction in circuit area can be achieved.

Ninth Embodiment

Figure 13:
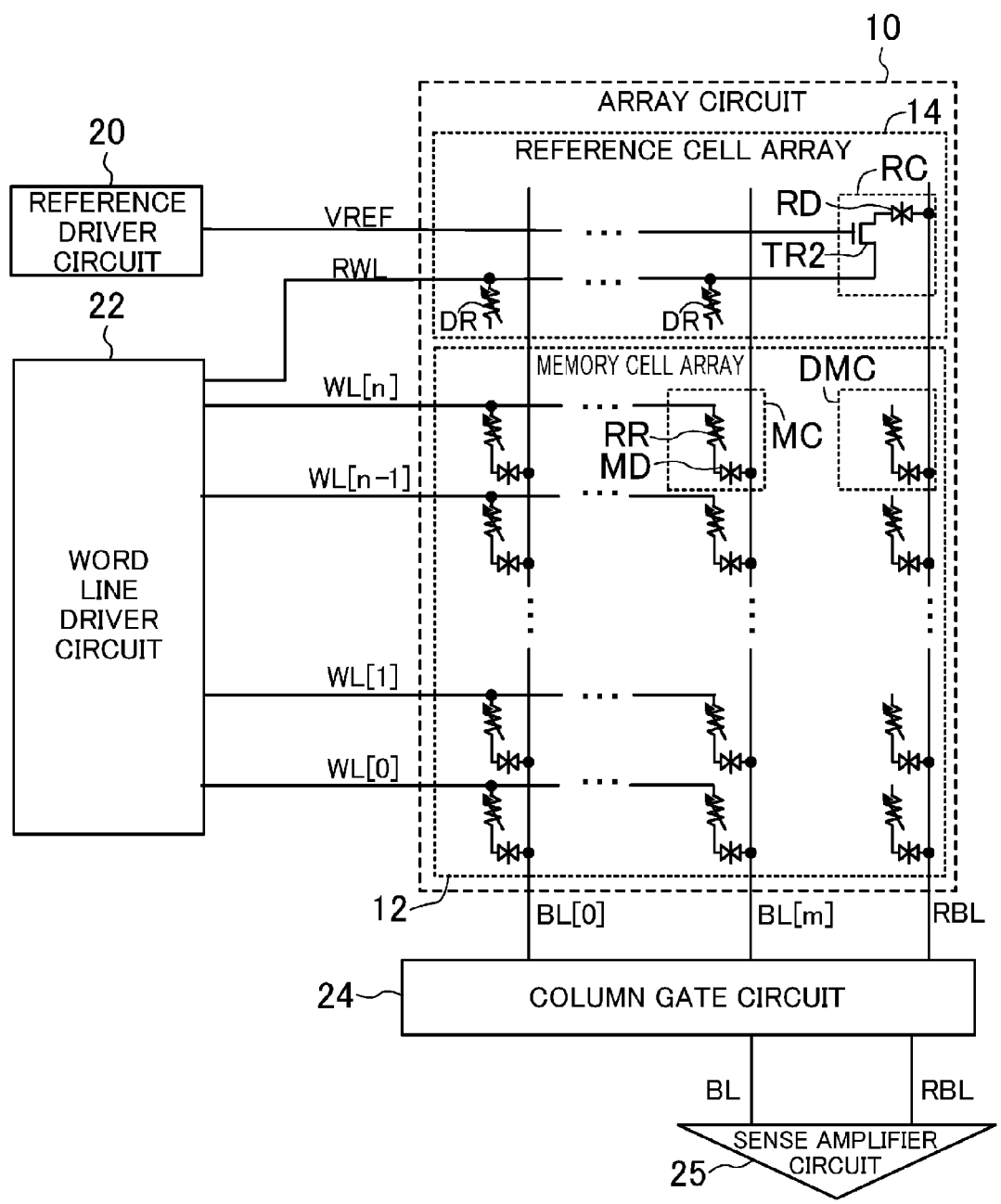
FIG. 13 is a circuit diagram showing details of an array circuit and its peripheral circuits according to the ninth embodiment.
Figure 14B:
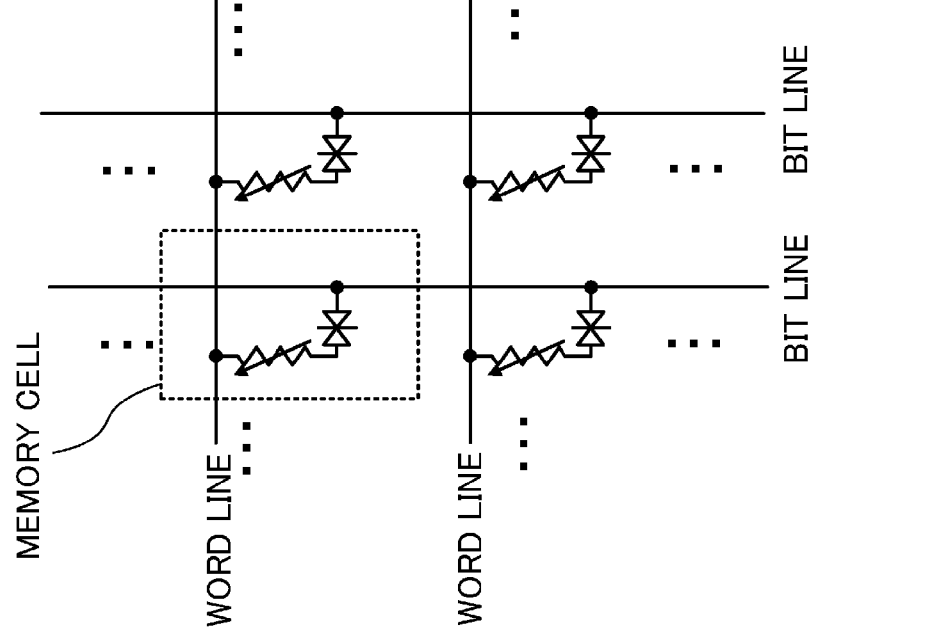
FIGS. 14A and 14B show circuit diagrams showing example configurations of memory cells of ReRAM.
Figure 14A:
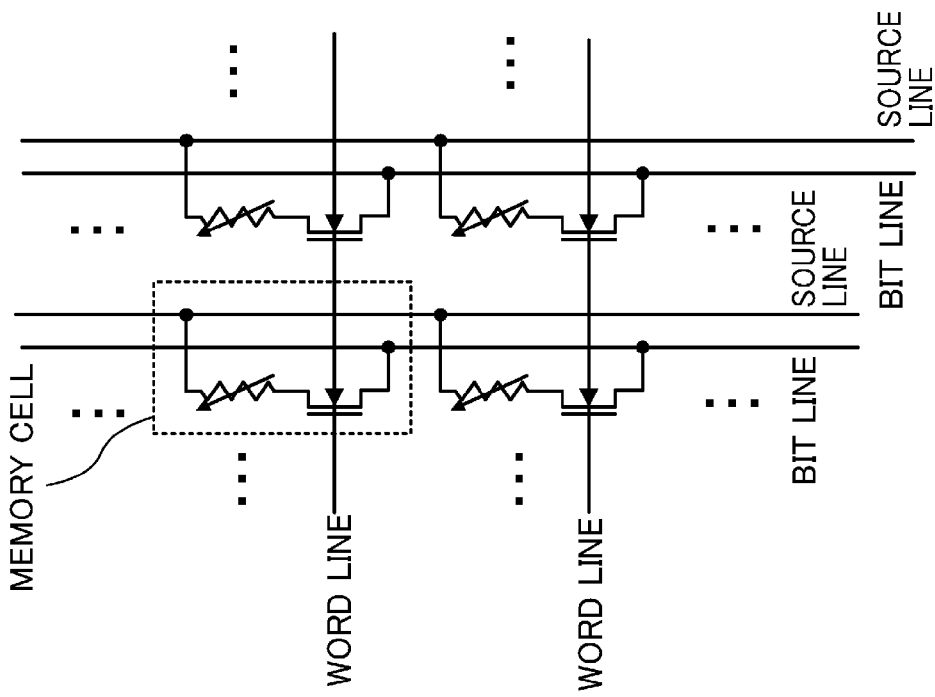
Figure 15:
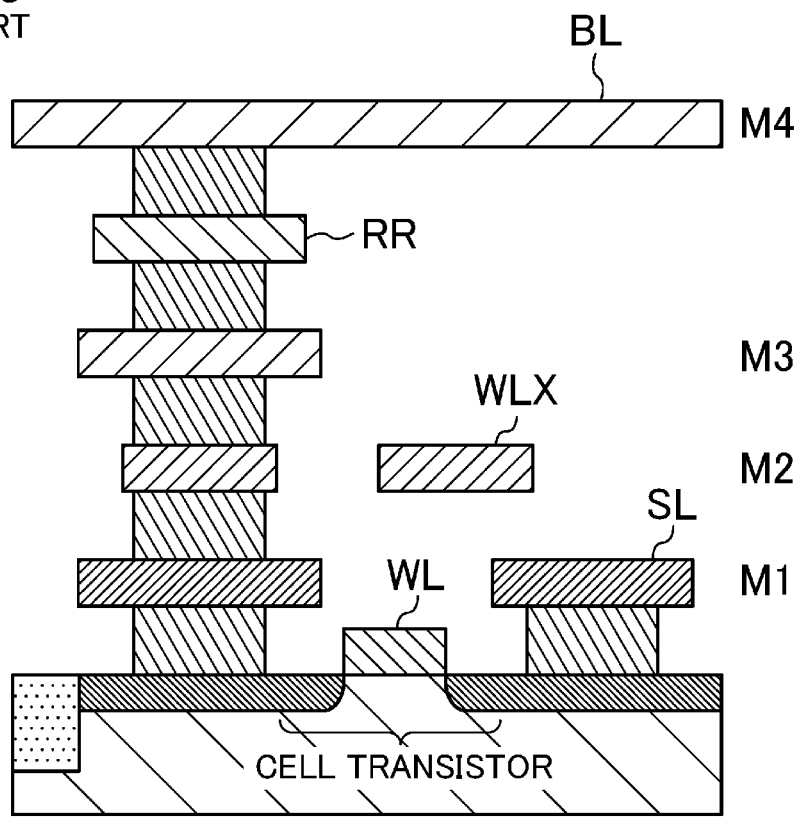
FIG. 15 is a cross-sectional view of a 1T1R memory cell.

FIG. 13 is a circuit diagram showing details of the array circuit and its peripheral circuits according to the ninth embodiment. The memory cells MC in this embodiment are cross-point memory cells, like the memory cells MC shown in FIG. 11. Note that common reference characters in FIGS. 11 and 13 denote identical components.

Each of the memory cells MC in this embodiment comprises a variable resistance element RR and a bidirectional diode MD serially connected to each other. The upper electrode of the variable resistance element RR is connected to its corresponding word line WL, and the lower electrode thereof is connected to the bidirectional diode MD. The other end of the bidirectional diode MD is connected to its corresponding bit line BL.

The reference cell RC comprises a transistor TR2 and a bidirectional diode RD serially connected to each other. The drain of the transistor TR2 is connected to one end of the bidirectional diode RD, and the source thereof is connected to the reference word line RWL. The other end of the bidirectional diode RD is connected to the reference bit line RBL.

The dummy memory cells DMC are configured similarly to the memory cells MC, but one end of the variable resistance element is open.

The read operation and the distribution measurement of the memory cell currents in this embodiment are similar to those in the eighth embodiment.

Thus, in this embodiment, also, similar advantages to those in the eighth embodiment can be obtained. In using cross-point memory cells, stress tends to be imposed on memory cells surrounding the selected memory cell during the read operation, etc. By using bidirectional diodes MD in the memory cells MC as in this embodiment, such stress can be reduced.

Note that, in the above embodiments, the dummy memory cells DMC may be omitted when the wiring capacitances of the reference bit line RBL and the bit lines BL are made equal to each other by a method other than the method of placing the dummy memory cells DMC.

While the nonvolatile semiconductor memory device has been described taking the resistive memory (ReRAM) as an example in the above embodiments, it may be flash memory, magnetoresistive random access memory (MRAM), phase change random access memory (PRAM), etc.

Note that, in the above embodiments, the expressions meaning the same (e.g., identical, the same shape, etc.) include variations in manufacturing.

What is claimed is:

1. A nonvolatile semiconductor memory device comprising:
    a memory cell array having a plurality of memory cells arranged in a matrix, wherein each of the memory cells includes a nonvolatile semiconductor memory element;
    a plurality of word lines placed in one-to-one correspondence with rows of the memory cell array and each connected in common to a plurality of memory cells arranged in a corresponding one of the rows;
    a plurality of bit lines placed in one-to-one correspondence with columns of the memory cell array and each connected in common to a plurality of memory cells arranged in a corresponding one of the columns;
    a plurality of source lines;
    a reference bit line;
    a reference source line;
    at least one reference cell including first and second transistors serially connected between the reference bit line and the reference source line;
    a reference word line connected to a gate of the first transistor of the reference cell; and
    a reference driver circuit configured to control a gate voltage of the second transistor of the reference cell, wherein
    the at least one reference cell includes a plurality of reference cells,
    the reference word line includes a plurality of reference word lines corresponding to the plurality of reference cells,
    each of the plurality of reference word lines is connected to the gate of the first transistor of a corresponding one of the reference cells, and
    the second transistor of at least one reference cell of the plurality of reference cells is configured to have a different transistor size from the second transistor of any other reference cell.

2. The nonvolatile semiconductor memory device of claim 1, wherein
    each of the plurality of memory cells includes a third transistor connected to the semiconductor memory element of the memory cell, and
    the third transistor of each of the plurality of memory cells is identical in gate oxide film thickness to at least either of the first and second transistors.

3. The nonvolatile semiconductor memory device of claim 1, wherein
    each of the plurality of memory cells includes a third transistor connected to the semiconductor memory element of the memory cell, and the third transistor of each of the plurality of memory cells is identical in gate channel length and gate channel width to at least either of the first and second transistors.

4. The nonvolatile semiconductor memory device of claim 1, further comprising:
   a sense amplifier circuit configured to determine data stored in the plurality of memory cells; and
   a column gate circuit configured to connect one of the plurality of bit lines to the sense amplifier circuit and also connect the reference bit line to the sense amplifier circuit.

5. The nonvolatile semiconductor memory device of claim 1, wherein
   a reference cell array including the reference cell is placed to be adjacent to the memory cell array in a direction identical to the column direction of the memory cell array.

6. The nonvolatile semiconductor memory device of claim 5, wherein
   the reference cell array includes two reference cell arrays, and
   the two reference cell arrays are placed to sandwich the memory cell array.

\* \* \* \* \*